(12) United States Patent
Kim et al.

(10) Patent No.: US 12,514,097 B2
(45) Date of Patent: Dec. 30, 2025

(54) DISPLAY DEVICE AND METHOD OF MANUFACTURING THE SAME

(71) Applicant: Samsung Display Co., Ltd., Yongin-Si (KR)

(72) Inventors: Jungi Kim, Hwaseong-si (KR); Woongsik Kim, Hwaseong-si (KR); Jeong Won Kim, Hwaseong-si (KR); Donghwan Bae, Seoul (KR); Jin-Su Byun, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 557 days.

(21) Appl. No.: 17/578,879

(22) Filed: Jan. 19, 2022

(65) Prior Publication Data
US 2023/0042183 A1 Feb. 9, 2023

(30) Foreign Application Priority Data
Aug. 6, 2021 (KR) .................. 10-2021-0103762

(51) Int. Cl.
*H10K 50/858* (2023.01)
*H10K 59/122* (2023.01)
*H10K 59/40* (2023.01)
*H10K 71/00* (2023.01)

(52) U.S. Cl.
CPC ......... *H10K 50/858* (2023.02); *H10K 59/122* (2023.02); *H10K 59/40* (2023.02); *H10K 71/00* (2023.02)

(58) Field of Classification Search
CPC .... H10K 50/858; H10K 59/122; H10K 59/40; H10K 71/00; H10K 50/844; G06F 3/0412; G06F 3/044; H01L 33/58; H01L 25/167; H01L 33/62; H01L 25/0753
See application file for complete search history.

(56) References Cited

U.S. PATENT DOCUMENTS

| 9,318,726 B2 | 4/2016 | Choi et al. |
| 9,406,724 B2 | 8/2016 | Choi et al. |
| 10,224,377 B2 | 3/2019 | Park et al. |

(Continued)

FOREIGN PATENT DOCUMENTS

| JP | 2011076799 A | 4/2011 |
| KR | 1020110044737 A | 4/2011 |

(Continued)

OTHER PUBLICATIONS

Kang et al KR 20160049157 Machine Translation (Year: 2016).*

(Continued)

*Primary Examiner* — Jessica S Manno
*Assistant Examiner* — Victor Joseph Lasasso
(74) *Attorney, Agent, or Firm* — CANTOR COLBURN LLP (57) ABSTRACT

A display device includes a substrate, an emission structure disposed on the substrate, a first refraction pattern disposed on the emission structure, a second refraction pattern disposed on the first refraction pattern and covering the first refraction pattern, where the second refraction pattern includes an inorganic material, and a third refraction pattern disposed on the second refraction pattern and having a refractive index less than a refractive index of the first refraction pattern.

15 Claims, 9 Drawing Sheets

(56) References Cited

U.S. PATENT DOCUMENTS

| | | | |
|---|---|---|---|
| 10,388,913 B2 | 8/2019 | Jung et al. | |
| 10,693,091 B2 | 6/2020 | Kim et al. | |
| 10,707,447 B2 | 7/2020 | Kim et al. | |
| 2008/0211386 A1 | 9/2008 | Choi et al. | |
| 2016/0118628 A1* | 4/2016 | Kang | H10K 59/879 257/40 |
| 2019/0115395 A1 | 4/2019 | Lee et al. | |
| 2020/0243802 A1* | 7/2020 | Ju | G06F 3/0412 |

FOREIGN PATENT DOCUMENTS

| | | | |
|---|---|---|---|
| KR | 20160049157 A | * | 5/2016 |
| KR | 1020190043655 A | | 4/2019 |
| KR | 1020200075597 A | | 6/2020 |
| KR | 20200092533 A | * | 8/2020 |
| KR | 1020210041675 A | | 4/2021 |

OTHER PUBLICATIONS

Ju et al KR 20200092533 Machine Translation (Year: 2020).*
Korean Office Action mailed Nov. 6, 2025 in KR Application No. 10-2021-0103762, 8 pages (w/English Translation).

* cited by examiner

DISPLAY DEVICE AND METHOD OF MANUFACTURING THE SAME

This application claims priority to Korean Patent Application No. 10-2021-0103762, filed on Aug. 6, 2021, and all the benefits accruing therefrom under 35 U.S.C. § 119, the content of which in its entirety is herein incorporated by reference.

BACKGROUND

1. Field

Embodiments of the invention relate generally to a display device and a method of manufacturing the display device.

2. Description of the Related Art

The display device may display an image using a light emitting diode. In the display device, it is desired that light generated from an emission layer of the light emitting diode is directed to a user positioned in the front direction of the display device. However, the light generated in the emission layer travels in several directions including the front direction and the side direction. Accordingly, the luminance in the front direction where the user is located may be lowered.

SUMMARY

Embodiments provide a display device with improved light efficiency.

Embodiments provide a method of manufacturing the display device.

An embodiment of a display device according to the invention includes a substrate, an emission structure disposed on the substrate, a first refraction pattern disposed on the emission structure, a second refraction pattern disposed on the first refraction pattern and covering the first refraction pattern, where the second refraction pattern includes an inorganic material, and a third refraction pattern disposed on the second refraction pattern and having a refractive index less than a refractive index of the first refraction pattern.

According to an embodiment, the second refraction pattern may be disposed between the first refraction pattern and the third refraction pattern.

According to an embodiment, the second refraction pattern may contact the first refraction pattern and the third refraction pattern.

According to an embodiment, the second refraction pattern may contact a side surface of the first refraction pattern.

According to an embodiment, the first refraction pattern and the third refraction pattern may not contact each other.

According to an embodiment, a refractive index of the second refraction pattern may be greater than the refractive index of the first refraction pattern.

According to an embodiment, the refractive index of the first refraction pattern may be about in a range of 1.6 to about 1.7.

According to an embodiment, a refractive index of the second refraction pattern may be greater than the refractive index of the third refraction pattern.

According to an embodiment, the refractive index of the third refraction pattern may be in a range of about 1.4 to about 1.6.

According to an embodiment, the emission structure may include a first electrode, a pixel defining layer disposed on the first electrode, where an opening exposing the first electrode may be defined in the pixel defining layer, an emission layer disposed in the opening, and a second electrode disposed on the emission layer. In such an embodiment, the first refraction pattern may overlap the opening.

According to an embodiment, the display device may further include a touch electrode disposed on the emission structure and a cover pattern disposed in a same layer as the second refraction pattern and covering the touch electrode.

According to an embodiment, the display device may further include a touch electrode disposed on the emission structure, and the second refraction pattern may further cover the touch electrode.

According to an embodiment, the display device may further include a fourth refraction pattern disposed between the second refraction pattern and the third refraction pattern.

According to an embodiment, a refractive index of the fourth refraction pattern may be greater than the refractive index of the first refraction pattern, a refractive index of the second refraction pattern, and the refractive index of the third refraction pattern.

According to an embodiment, each of the first refraction pattern and the third refraction pattern may include an organic material.

An embodiment of a method of manufacturing a display device according to the invention includes providing an emission structure on a substrate, providing a first refraction pattern disposed on the emission structure, providing a second refraction pattern on the first refraction pattern, and providing a third refraction pattern on the second refraction pattern. In such an embodiment, the second refraction pattern covers the first refraction pattern and includes an inorganic material, and a refractive index of the third refraction pattern is less than a refractive index of the first refraction pattern.

According to an embodiment, the providing the second refraction pattern may include forming a refraction layer on the first refraction pattern and patterning the refraction layer so that the refraction layer covers the first refraction pattern.

According to an embodiment, the method may further include providing a fourth refraction pattern between the second refraction pattern and the fourth refraction pattern.

According to an embodiment, a refractive index of the fourth refraction pattern may be greater than the refractive index of the first refraction pattern, a refractive index of the second refraction pattern, and the refractive index of the third refraction pattern.

In embodiments of the invention, a display device may include a first refraction pattern, a second refraction pattern, and a third refraction pattern. In such embodiments, the first refraction pattern may be disposed on the emission structure and may overlap the emission layer. The second refraction pattern may be disposed between the first refraction pattern and the third refraction pattern. In such embodiments, a second refractive index of the second refraction pattern may be greater than a first refractive index of the first refraction pattern, and the first refractive index may be greater than a third refractive index of the third refraction pattern. Accordingly, light emitted from the emission layer may be reflected or refracted while passing through the first refraction pattern, the second refraction pattern, and the third refraction pattern. The light may be emitted to the front of the display device, and the light efficiency of the display device may be improved.

In such embodiments, the second refraction pattern including an inorganic material may contact an upper surface and a side surface of the first refraction pattern and may cover the first refraction pattern. In such embodiments, the second refraction pattern may contact the first refraction pattern and the third refraction pattern. Accordingly, the first refraction pattern including the organic material and the third refraction pattern including the organic material may not contact each other. Accordingly, the first refraction pattern and the third refraction pattern may not be mixed with each other. In such embodiments, since a trapezoidal shape of the first refraction pattern may be maintained, a taper angle of the first refraction pattern may be maintained. In such embodiments, chemical resistance of the first refraction pattern, the second refraction pattern, and the third refraction pattern may be improved.

BRIEF DESCRIPTION OF THE DRAWINGS

The above and other features of the invention will become more apparent by describing in further detail embodiments thereof with reference to the accompanying drawings, in which.

DETAILED DESCRIPTION

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the invention will be described in detail with reference to the accompanying drawings.

Figure 1:
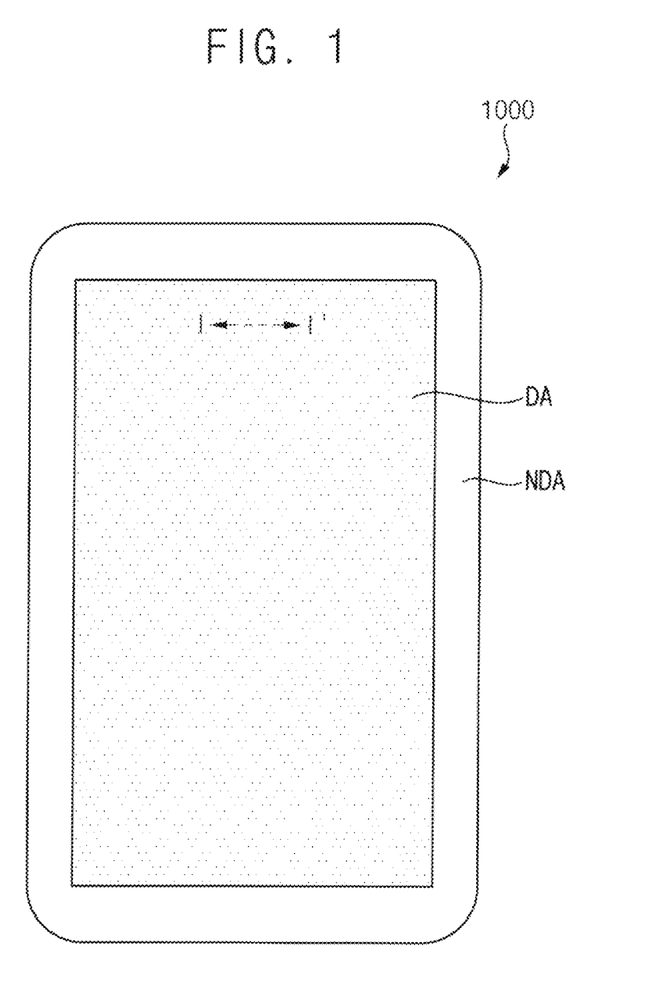
FIG. 1 is a plan view illustrating a display device according to an embodiment.

FIG. 1 is a plan view illustrating a display device according to an embodiment.

Referring to FIG. 1, an embodiment of a display device 1000 may be divided into a display area DA and a non-display area NDA. In an embodiment, for example, the display area DA may have a rectangular shape, and the non-display area NDA may be positioned to surround the display area DA. At least one pixel may be disposed in the display area DA, and an image may be displayed through the pixels in the display area DA. Drivers for driving the pixel may be disposed in the non-display area NDA. The drivers may provide a signal and/or a voltage to the pixel. The pixel may emit light in response to the signal and/or the voltage.

Figure 2:
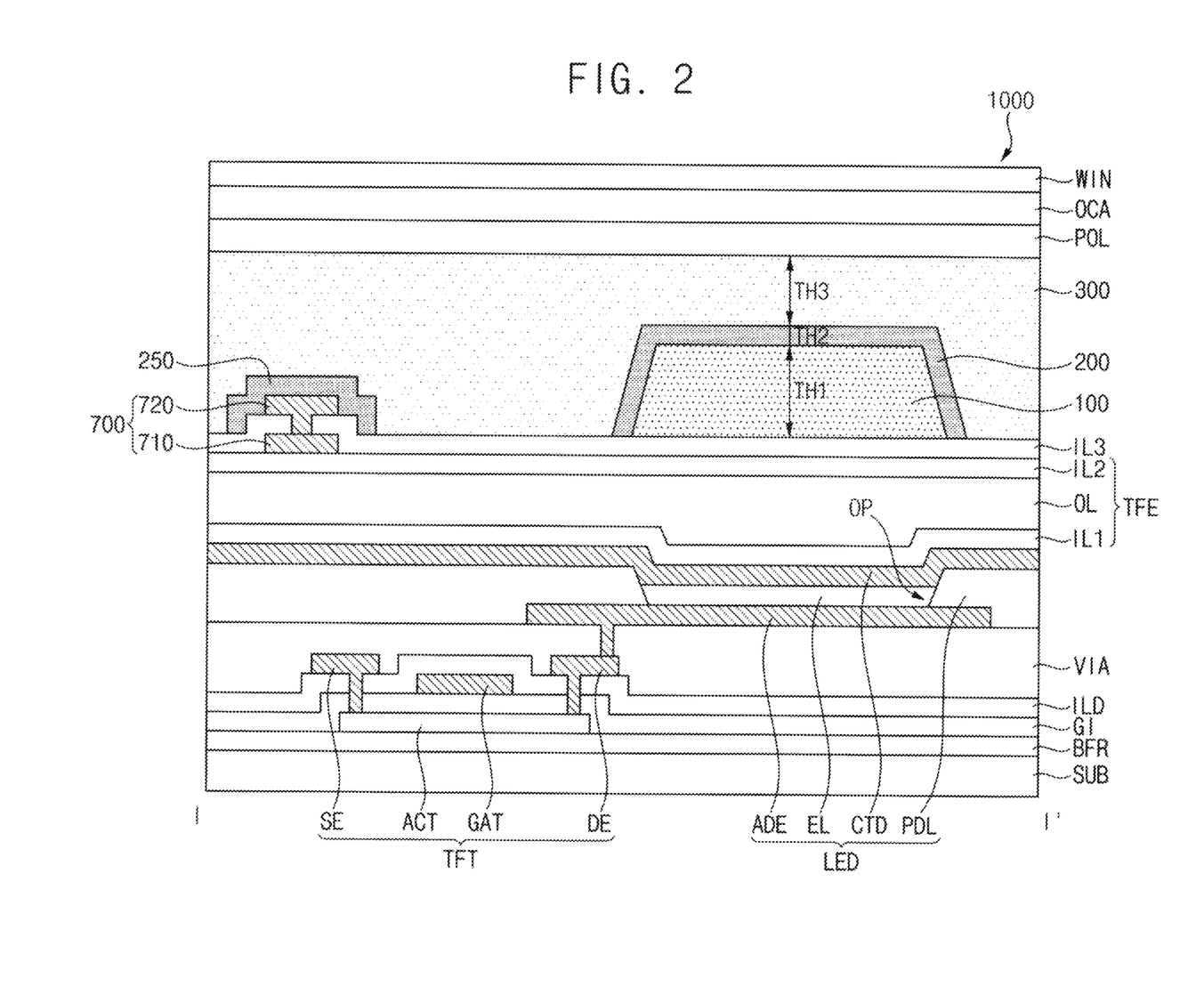
FIG. 2 is a cross-sectional view illustrating the display device of FIG. 1.

FIG. 2 is a cross-sectional view illustrating the display device of FIG. 1. Particularly, FIG. 2 is a cross-sectional view taken along line I-I' of FIG. 1.

Referring to FIG. 2, an embodiment of the display device 1000 may include a substrate SUB, a buffer layer BFR, an active pattern ACT, a gate insulating layer GI, a gate electrode GAT, an interlayer insulating layer ILD, a source electrode SE, a drain electrode DE, a via insulating layer VIA, a first electrode ADE, a pixel defining layer PDL, an emission layer EL, a second electrode CTD, a first inorganic layer IL1, an organic layer OL, a second inorganic layer IL2, a first touch electrode 710, a third inorganic layer IL3, a second touch electrode 720, a first refraction pattern 100, a second refraction pattern 200, a cover pattern 250, a third refraction pattern 300, a polarization layer POL, a planarization layer OCA, and a window WIN.

The substrate SUB may include a transparent or opaque material. In an embodiment, the material of the substrate SUB may be glass, quartz, plastic, or the like. These may be used alone or in combination with each other. In an embodiment where the substrate SUB includes or is formed of glass having rigidity, the display device 1000 may be implemented as a rigid display device. In an embodiment where the substrate SUB includes or is formed of flexible plastic, the display device 1000 may be implemented as a flexible display device.

The buffer layer BFR may be disposed on the substrate SUB. The buffer layer BFR may prevent diffusion of metal atoms or impurities from the substrate SUB to the active pattern ACT. In an embodiment, the buffer layer BFR may control a heat supply rate during a crystallization process for forming the active pattern ACT. In an embodiment, the buffer layer BFR may include or be formed of an insulating material. In such an embodiment, the insulating material of the buffer layer BFR may be silicon oxide, silicon nitride, silicon oxynitride, and the like, for example. These may be used alone or in combination with each other.

The active pattern ACT may be disposed on the buffer layer BFR. In an embodiment, the active pattern ACT may include or be formed of a silicon semiconductor material or an oxide semiconductor material. In an embodiment, the silicon semiconductor material of the active pattern ACT may be amorphous silicon, polycrystalline silicon, or the like, for example.

The gate insulating layer GI may be disposed on the active pattern ACT and may cover the active pattern ACT. In an embodiment, the gate insulating layer GI may include or be formed of an insulating material. In an embodiment, the insulating material of the gate insulating layer GI may be silicon oxide, silicon nitride, silicon oxynitride, and the like, for example. These may be used alone or in combination with each other.

The gate electrode GAT may be disposed on the gate insulating layer GI and may overlap the active pattern ACT. In an embodiment, the gate electrode GAT may include or be formed of a metal, an alloy, a conductive metal oxide, a transparent conductive material, or the like. In an embodiment, the material of the gate electrode GAT may be silver (Ag), an alloy containing silver, molybdenum (Mo), an alloy containing molybdenum, aluminum (Al), alloy containing aluminum, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), indium tin oxide ("ITO"), indium zinc oxide ("IZO"), and the like, for example. These may be used alone or in combination with each other.

The interlayer insulating layer ILD may be disposed on the gate electrode GAT and may cover the gate electrode GAT. In an embodiment, the interlayer insulating layer ILD may include or be formed of an insulating material.

Each of the source electrode SE and the drain electrode DE may be disposed on the interlayer insulating layer ILD and may contact the active pattern ACT. In an embodiment, the source electrode SE and the drain electrode DE may include or be formed of a metal, an alloy, a conductive metal oxide, a transparent conductive material, or the like.

The active pattern ACT, the gate electrode GAT, the source electrode SE, and the drain electrode DE may constitute a transistor TFT. The transistor TFT may generate a driving current and may supply the driving current to an emission structure LED.

The via insulating layer VIA may be disposed on the source electrode SE and the drain electrode DE, and may cover the source electrode SE and the drain electrode DE. The via insulating layer VIA may include or be formed of an insulating material. In an embodiment, the insulating material of the via insulating layer VIA may be photoresist, polyacrylic resin, polyimide-based resin, acrylic resin, epoxy-based resin, acrylate-based resin, and the like, for example. These may be used alone or in combination with each other.

The first electrode ADE may be disposed on the via insulating layer VIA and may contact the drain electrode DE. The first electrode ADE may be a reflective electrode or a transparent electrode. In an embodiment, the first electrode ADE may include or be formed of a metal, an alloy, a conductive metal oxide, a transparent conductive material, or the like.

The pixel defining layer PDL may be disposed on the first electrode ADE. An opening OP exposing the first electrode ADE may be defined in the pixel defining layer PDL. Accordingly, the opening OP may define an emission area of the emission structure LED. The pixel defining layer PDL may include or be formed of an insulating material. In an embodiment, the insulating material of the pixel defining layer PDL may be a photoresist, a polyacrylic resin, a polyimide-based resin, an acrylic resin, an epoxy-based resin, an acrylate-based resin, and the like, for example. These may be used alone or in combination with each other.

The emission layer EL may be disposed in the opening OP on the first electrode ADE. The emission layer EL may include or be formed of a material that emits light by an electric current. Due to a potential difference between the first electrode ADE and the second electrode CTD, the emission layer EL may emit light.

The second electrode CTD may be disposed on the emission layer EL. In an embodiment, for example, the second electrode CTD may be in a plate shape and may be a transparent electrode. In an embodiment, the second electrode CTD may include or be formed of a metal, an alloy, a conductive metal oxide, a transparent conductive material, or the like.

The first electrode ADE, the pixel defining layer PDL, the emission layer EL, and the second electrode CTD may constitute the emission structure LED.

In an embodiment, the emission structure included in the display device 1000 may not be limited to the emission structure LED shown in FIG. 2. In an embodiment, for example, the emission structure may be a light emitting diode including at least one selected from a micro light emitting diode ("micro-LED"), a nano light emitting diode ("nano-LED"), a quantum dot ("QD"), and a quantum rod ("QR").

The first inorganic layer IL1 may be disposed on the second electrode CTD. In an embodiment, the first inorganic layer IL1 may include or be formed of an inorganic material. In an embodiment, the insulating material of the first inorganic layer IL1 may be silicon oxide, silicon nitride, silicon oxynitride, and the like, for example. These may be used alone or in combination with each other.

The organic layer OL may be disposed on the first inorganic layer IL1. In an embodiment, the organic layer OL may include or be formed of an organic material. In an embodiment, the organic material of the organic layer OL may be a photoresist, a polyacrylic resin, a polyimide-based resin, an acrylic resin, an epoxy-based resin, and an acrylate-based resin, for example. These may be used alone or in combination with each other.

The second inorganic layer IL2 may be disposed on the organic layer OL. In an embodiment, the second inorganic layer IL2 may include or be formed of an inorganic material.

The first inorganic layer IL1, the organic layer OL, and the second inorganic layer IL2 may constitute an encapsulation layer TFE. The encapsulation layer TFE may prevent impurities from penetrating into the emission structure LED. However, the encapsulation layer TFE is not limited to that described above. In an alternative embodiment, for example, the encapsulation layer TFE may be implemented as a single layer or have a single layer structure.

The first touch electrode 710 may be disposed on the second inorganic layer IL2. In an embodiment, the first touch electrode 710 may extend in a first direction (e.g., X direction) on a plane or when viewed from a plan view. The first touch electrode 710 may be formed of a metal, an alloy, a conductive metal oxide, a transparent conductive material, or the like.

The third inorganic layer IL3 may be disposed on the first touch electrode 710 and may cover the first touch electrode 710. In an embodiment, the third inorganic layer IL3 may include or be formed of an insulating material.

The second touch electrode 720 may be disposed on the third inorganic layer IL3 and may overlap the first touch electrode 710. In an embodiment, the second touch electrode 720 may extend in a second direction (e.g., Y direction) crossing the first direction on a plane. The second touch electrode 720 may include or be formed of a metal, an alloy, a conductive metal oxide, a transparent conductive material, or the like.

The first touch electrode 710 and the second touch electrode 720 may constitute a sensing layer 700. The sensing layer 700 may detect a change in capacitance formed between the first touch electrode 710 and the second touch electrode 720. Accordingly, the sensing layer 700 may function as an input means of the display device 1000.

The first refraction pattern 100 may be disposed on the third inorganic layer IL3. In an embodiment, the first refraction pattern 100 may have a trapezoidal shape. The first refraction pattern 100 may overlap the opening OP in the pixel defining layer PDL. In such an embodiment, the first refraction pattern 100 may overlap the emission layer EL. The first refraction pattern 100 may have a predetermined first refractive index. In an embodiment, for example, the first refractive index may be in a range of about 1.6 to about 1.7. In an embodiment, the first refraction pattern 100 may have a predetermined first thickness TH1. In an embodiment, for example, the first thickness TH1 may be in a range of about 1.5 micrometers (μm) to about 3 μm.

In an embodiment, the first refraction pattern 100 may include or be formed of an organic material having the first refractive index. In an embodiment, the organic material of the first refraction pattern 100 may be a photoresist, a polyacrylic resin, a polyimide-based resin, an acrylic resin, an epoxy-based resin, an acrylate-based resin, and the like, for example. These may be used alone or in combination with each other.

The second refraction pattern 200 may be disposed on the first refraction pattern 100 and may cover the first refraction pattern 100. In an embodiment, for example, the second refraction pattern 200 may contact an upper surface and a side surface of the first refraction pattern 100. The second refraction pattern 200 may have a second refractive index greater than the first refractive index. In an embodiment, for example, the second refractive index may be in a range of about 1.65 to about 1.9. In an embodiment, the second refraction pattern 200 may have a predetermined second thickness TH2. In an embodiment, for example, the second thickness TH2 may be less than the first thickness TH1.

In an embodiment, the second refraction pattern 200 may include or be formed of an inorganic material having the second refractive index. In an embodiment, the inorganic material of the second refraction pattern 200 may be silicon oxide, silicon nitride, silicon oxynitride, and the like, for example. These may be used alone or in combination with each other.

The cover pattern 250 may be disposed on the second touch electrode 720 and may cover the second touch electrode 720. In an embodiment, the cover pattern 250 may be formed together with the second refraction pattern 200. The cover pattern 250 may prevent the second touch electrode 720 from being corroded.

The third refraction pattern 300 may be disposed on the second refraction pattern 200 and the cover pattern 250 and may cover the second refraction pattern 200. The third refraction pattern 300 may contact the third inorganic layer IL3. The third refraction pattern 300 may have a third refractive index less than the first refractive index and the second refractive index. In an embodiment, for example, the third refractive index may be in a range of about 1.4 to about 1.6. In an embodiment, the third refraction pattern 300 may have a predetermined third thickness TH3. For example, the third thickness TH3 may be a thickness from an upper surface of the second refraction pattern 200 to an upper surface of the third refraction pattern 300. In an embodiment, for example, the third thickness TH3 may be sufficient to compensate for a step difference caused by the first refraction pattern 100. The third thickness TH3 may be greater than the first thickness TH1 and the second thickness TH2 and may be in a range of about 3 μm to about 10 μm.

In an embodiment, the third refraction pattern 300 may include or be formed of an organic material having the third refractive index. In an embodiment, the organic material of the third refraction pattern 300 may include a photoresist, a polyacrylic resin, a polyimide-based resin, an acrylic resin, an epoxy-based resin, an acrylate-based resin, and the like, for example. These may be used alone or in combination with each other.

In an embodiment, the second refraction pattern 200 may be disposed between the first refraction pattern 100 and the third refraction pattern 300. In such an embodiment, the second refraction pattern 200 may contact the first refraction pattern 100 and the third refraction pattern 300. Accordingly, the first refraction pattern 100 and the third refraction pattern 300 may not contact each other.

The polarization layer POL may be disposed on the third refraction pattern 300. The polarization layer POL may polarize light. Accordingly, the polarization layer POL suppresses reflection of external light, thereby improving the optical efficiency of the display device 1000.

Alternatively, the display device 1000 may not include the polarization layer POL. In such an embodiment, the display device 1000 may include at least one color filter disposed on the third refraction pattern 300. The color filter may block light having a predetermined wavelength to improve color reproducibility of the display device 1000.

The planarization layer OCA may be disposed on the polarization layer POL. In an embodiment, the planarization layer OCA may include or be formed of an organic material. In an embodiment, the organic material of the planarization layer OCA may be a photoresist, a polyacrylic resin, a polyimide-based resin, an acrylic resin, an epoxy-based resin, an acrylate-based resin, and the like, for example. These may be used alone or in combination with each other. The planarization layer OCA may have a substantially flat top surface. Accordingly, the planarization layer OCA may compensate for a step difference of a lower surface.

The window WIN may be disposed on the planarization layer OCA. In an embodiment, the material of the window WIN may be glass, quartz, plastic, and the like, for example. These may be used alone or in combination with each other. The window WIN may protect components disposed therebelow, that is, the above-described components, from external forces.

The display device 1000 may include the first refraction pattern 100, the second refraction pattern 200, and the third refraction pattern 300. The first refraction pattern 100 may be disposed on the emission structure LED and may overlap the opening OP (or the emission layer EL) of the pixel defining layer PDL. The second refraction pattern 200 may be disposed between the first refraction pattern 100 and the third refraction pattern 300. The third refraction pattern 300 may cover the second refraction pattern 200. In such an embodiment, the second refractive index may be greater than the first refractive index, and the first refractive index may be greater than the third refractive index. Accordingly, light emitted from the emission layer EL may be reflected or refracted while passing through the first refraction pattern 100, the second refraction pattern 200, and the third refraction pattern 300. The light may be emitted to the front of the display device 1000, and the light efficiency of the display device 1000 may be improved.

In an embodiment, the second refraction pattern 200 including or formed of an inorganic material may contact the upper surface and the side surface of the first refraction pattern 100, and may cover the first refraction pattern 100. In such an embodiment, the second refraction pattern 200 may contact the first refraction pattern 100 and the third refraction pattern 300. Accordingly, the first refraction pattern 100 including or formed of an organic material and the third refraction pattern 300 including or formed of the organic material may not contact each other. Accordingly, the first refraction pattern 100 and the third refraction pattern 300 may not be mixed with each other. In such an embodiment, since the trapezoidal shape of the first refraction pattern 100 may be maintained, a taper angle of the first refraction pattern 100 may be maintained. In such an embodiment, chemical resistance of the first refraction pattern 100, the second refraction pattern 200, and the third refraction pattern 300 may be improved.

FIG. 3 to FIG. 7 are cross-sectional views illustrating a method of manufacturing the display device of FIG. 2.

Figure 3:
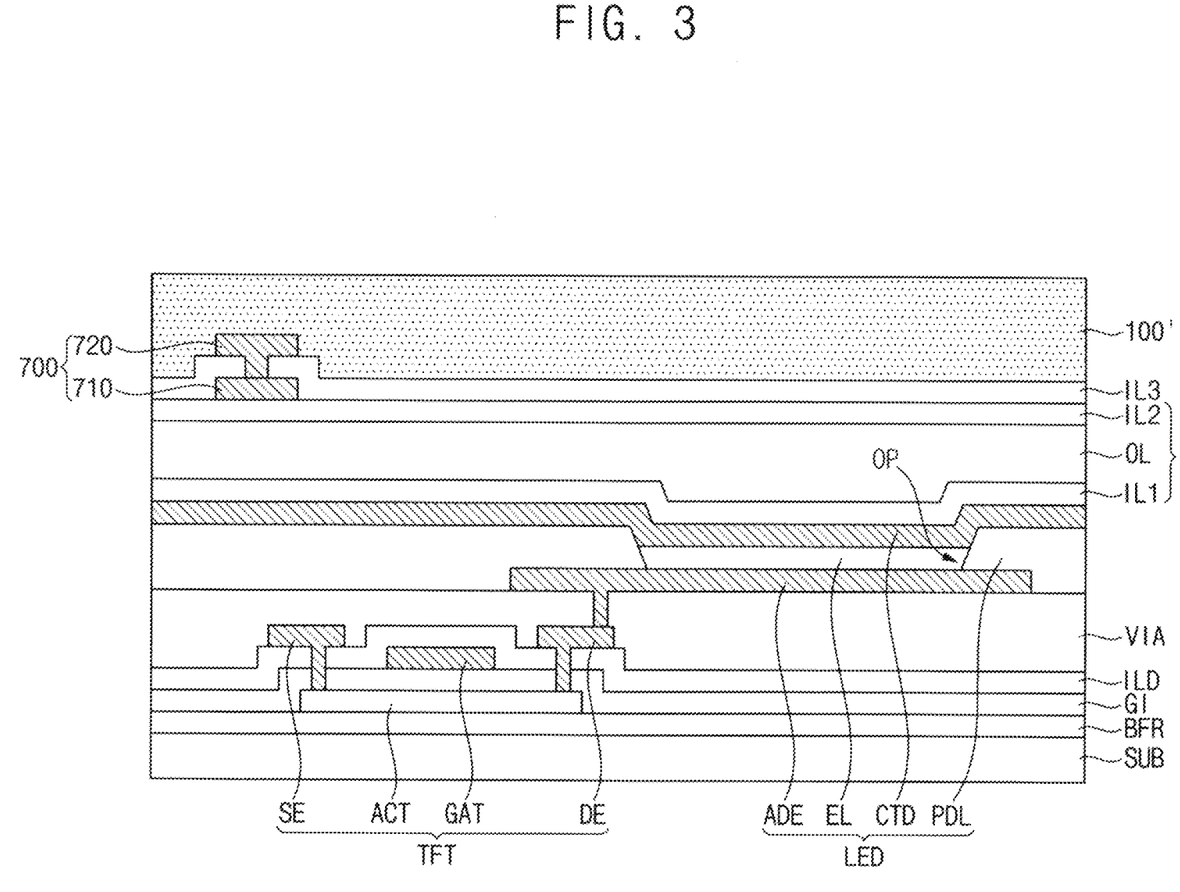
FIG. 3 to FIG. 7 are cross-sectional views illustrating a method of manufacturing the display device of FIG. 2.

Referring to FIG. 3, the emission structure LED may be provided or formed on the substrate SUB, and a first refraction layer 100' may be provided or formed on the third inorganic layer IL3 and the second touch electrode 720. The first refraction layer 100' may be formed of an organic material and may be entirely provided on the third inorganic layer IL3.

Figure 4:
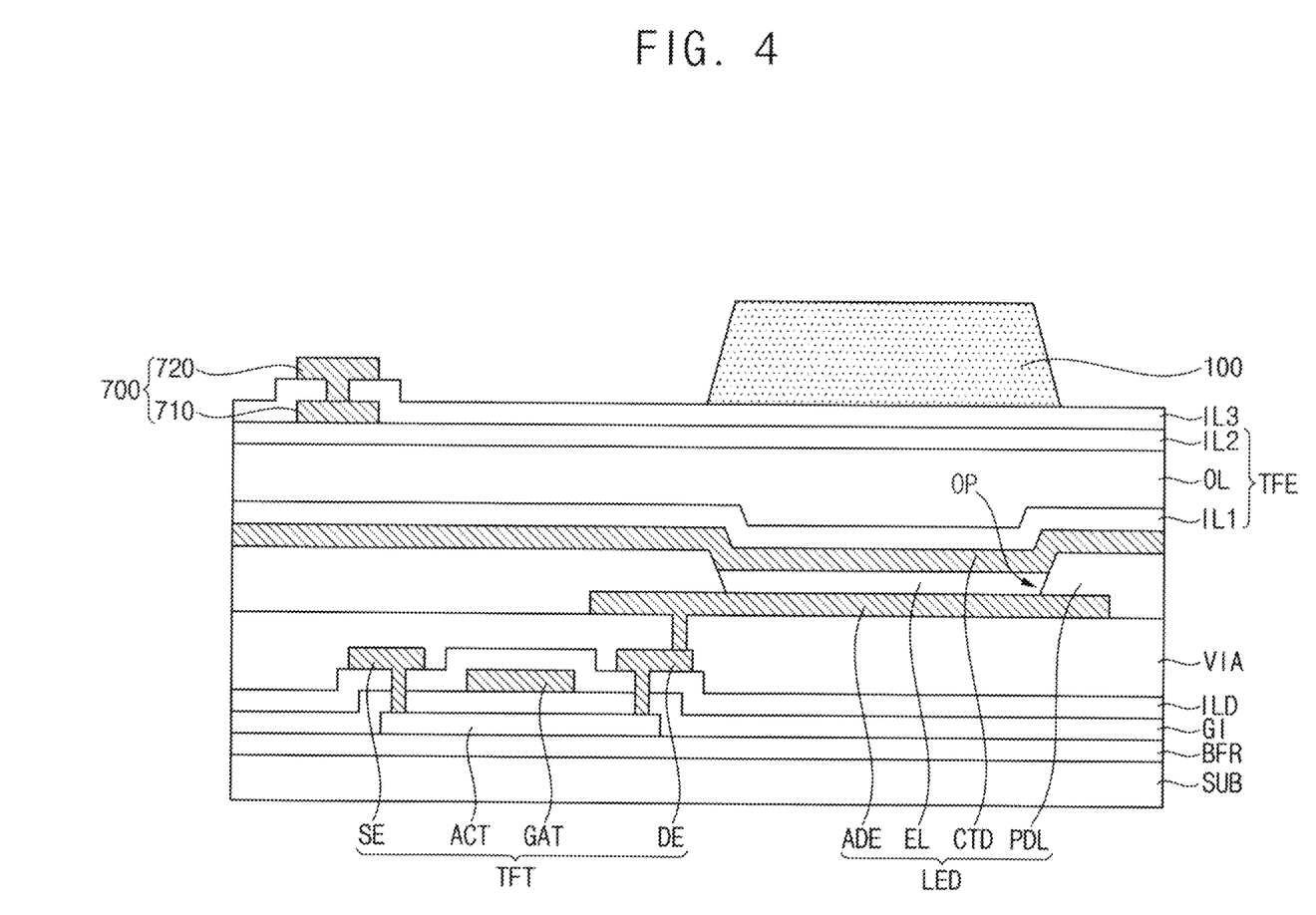

Referring to FIG. 4, the first refraction layer 100' may be patterned, and the first refraction pattern 100 may be formed. In an embodiment, the first refraction layer 100' may be patterned through a photolithography process. In an embodiment, for example, a mask may be disposed on the first refraction layer 100' to be spaced apart from the first refraction layer 100', and ultraviolet rays may be radiated toward the mask. The ultraviolet rays may be radiated to the first refraction layer 100' along a pattern of the mask, and a portion of the first refraction layer 100' may be removed. Accordingly, the first refraction pattern 100 may be formed. As described above, the first refraction pattern 100 may be formed to overlap the opening OP (or the emission layer EL) of the pixel defining layer PDL.

Figure 5:
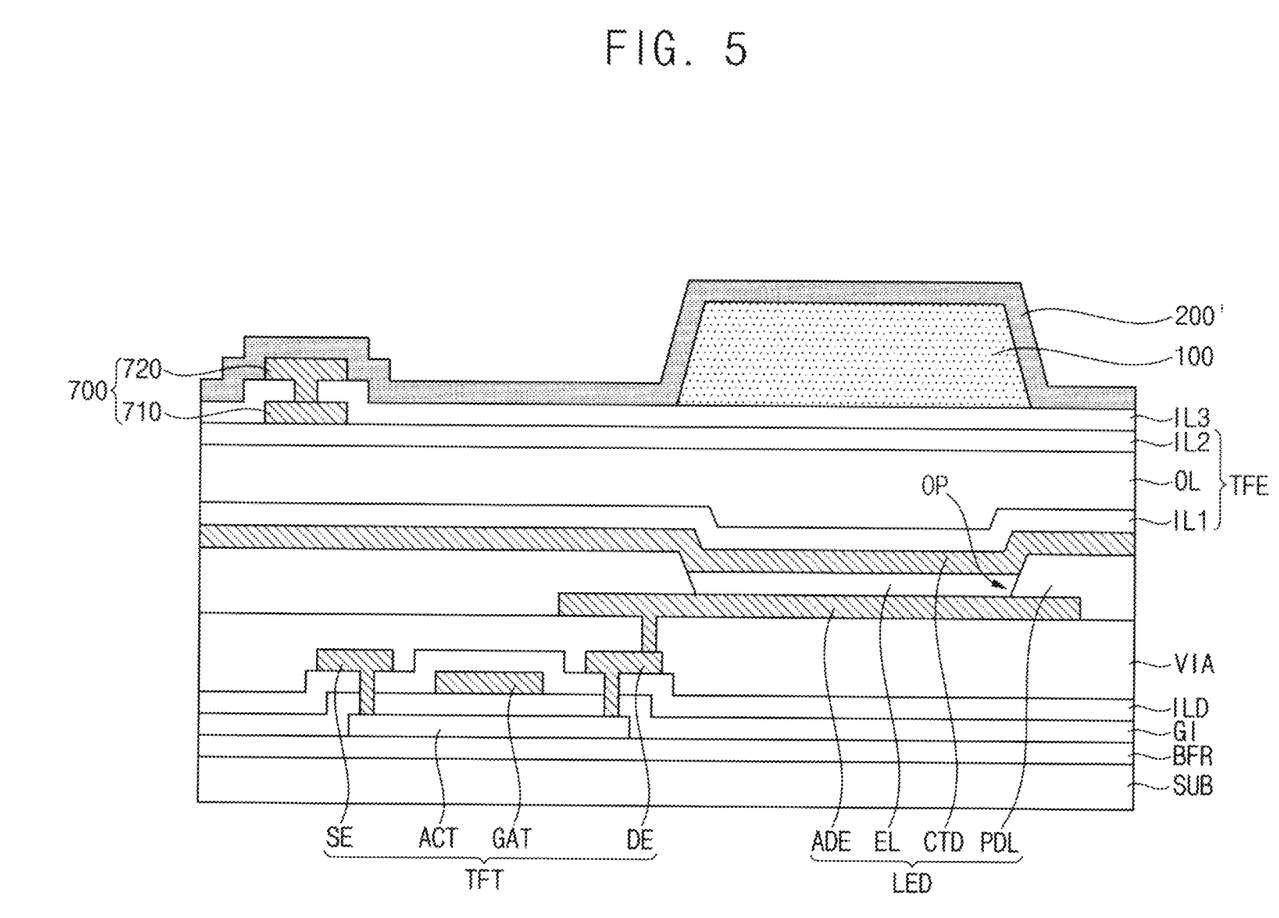

Referring to FIG. 5, a second refraction layer 200' may be provided or formed on the third inorganic layer IL3, the first refraction pattern 100, and the second touch electrode 720. The second refraction layer 200' may be formed of an inorganic material and may entirely cover the first refraction pattern 100 and the second touch electrode 720.

Figure 6:
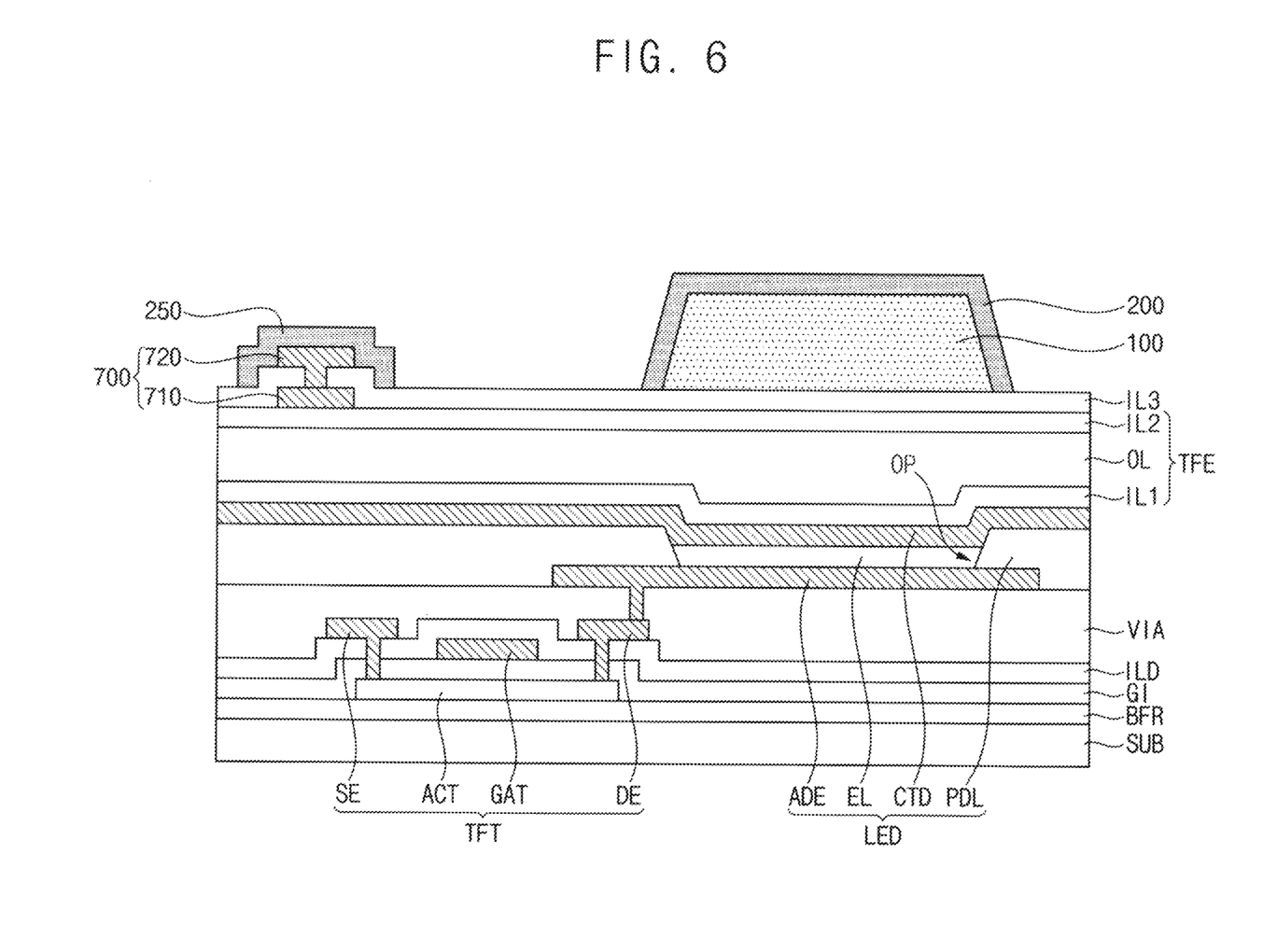

Referring to FIG. 6, the second refraction layer 200' may be patterned, and the second refraction pattern 200 and the cover pattern 250 may be formed. In an embodiment, the second refraction layer 200' may be patterned through a photolithography process. In an embodiment, for example, a photoresist pattern may be provided or formed on the second refraction layer 200', and ultraviolet rays may be radiated to form the second refraction pattern 200 and the cover pattern 250. As described above, the second refraction pattern 200 may be formed to cover the first refraction pattern 100, and the cover pattern 250 may be formed to cover the second touch electrode 720.

Figure 7:
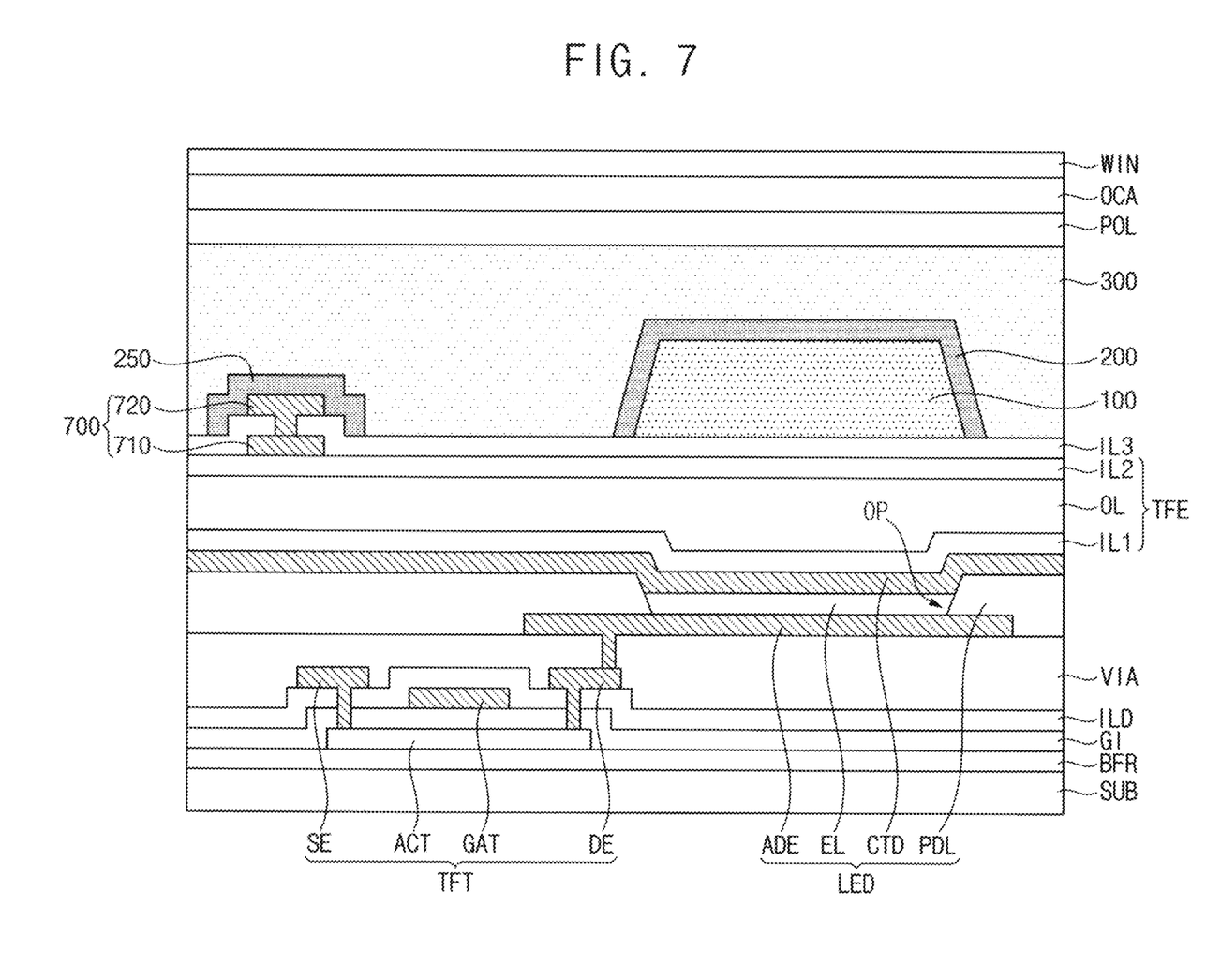

Referring to FIG. 7, the third refraction pattern 300 may be provided or formed on the third inorganic layer IL3, the second refraction pattern 200, and the cover pattern 250. In an embodiment, the third refraction pattern 300 may be formed through an inkjet printing process. In an alternative embodiment, the third refraction pattern 300 may be formed through a photolithography process.

Figure 8:
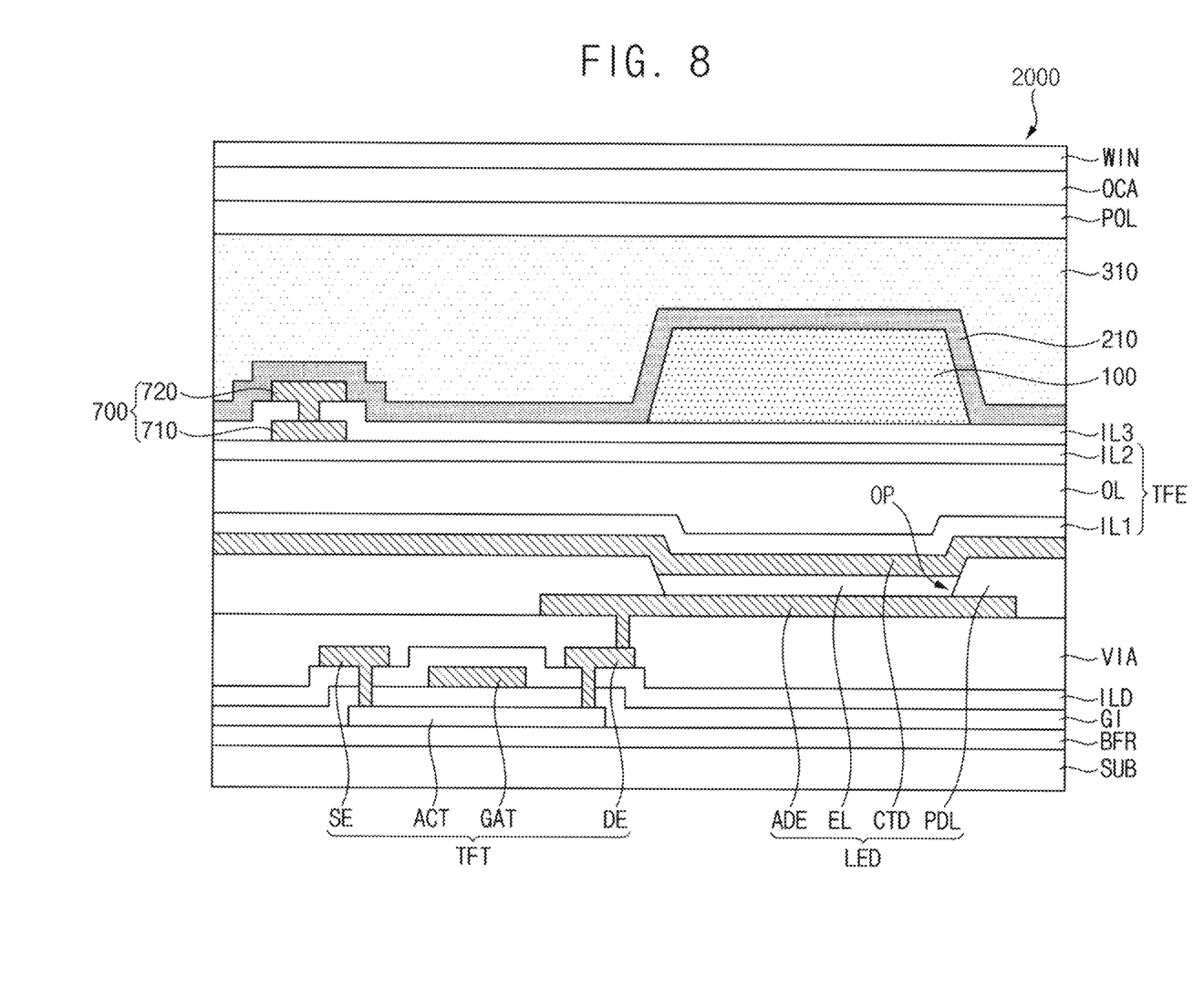
FIG. 8 is a cross-sectional view illustrating a display device according to an alternative embodiment.

FIG. 8 is a cross-sectional view illustrating a display device according to an alternative embodiment.

Referring to FIG. 8, an embodiment of a display device 2000 may include the substrate SUB, the buffer layer BFR, the active pattern ACT, the gate insulating layer GI, the gate electrode GAT, the interlayer insulating layer ILD, the source electrode SE, the drain electrode DE, the via insulating layer VIA, the first electrode ADE, the pixel defining layer PDL, the emission layer EL, the second electrode CTD, the first inorganic layer IL1, the organic layer OL, the second inorganic layer IL2, the first touch electrode 710, the third inorganic layer IL3, the second touch electrode 720, the first refraction pattern 100, a second refraction pattern 210, a third refraction pattern 310, the polarization layer POL, the planarization layer OCA, and the window WIN.

In such an embodiment, the display device 2000 may be substantially the same as the display device 1000 described with reference to FIG. 2 except for the shapes of the second refraction pattern 210 and the third refraction pattern 310.

In such an embodiment, the second refraction pattern 210 may be disposed on the first refraction pattern 100 and may cover the first refraction pattern 100. In an embodiment, for example, the second refraction pattern 210 may contact an upper surface and a side surface of the first refraction pattern 100. In such an embodiment, the second refraction pattern 210 may further cover the second touch electrode 720. In such an embodiment, the second refraction pattern 210 may be entirely disposed on the third inorganic layer IL3, the first refraction pattern 100, and the second touch electrode 720. In such an embodiment, the second refraction pattern 210 may not be patterned. Accordingly, process of the display device 2000 may be simplified.

The third refraction pattern 310 may be disposed on the second refraction pattern 210. As the second refraction pattern 210 is entirely formed on the third inorganic layer IL3, the third refraction pattern 310 may not contact the third inorganic layer IL3.

Figure 9:
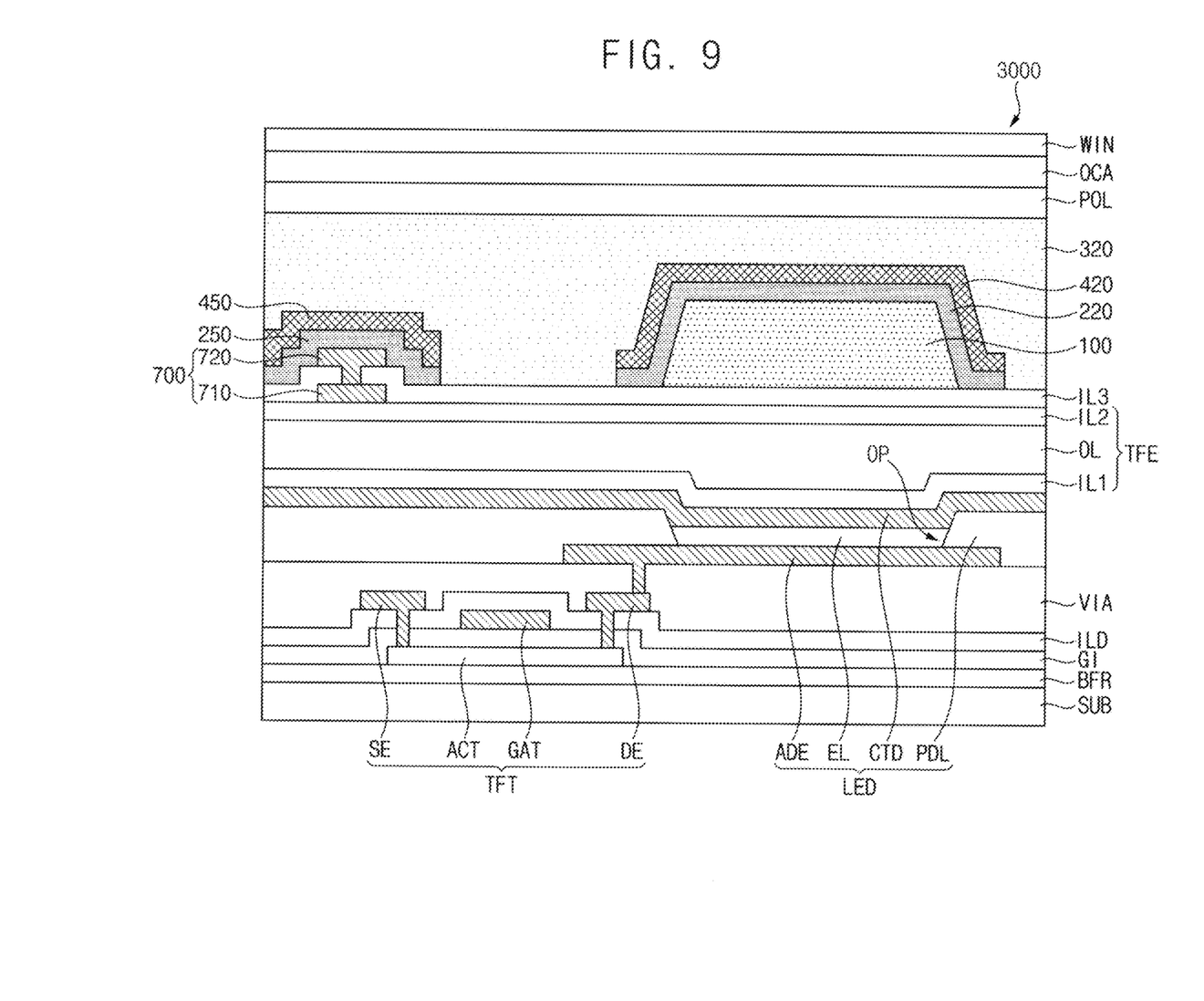
FIG. 9 is a cross-sectional view illustrating a display device according to another alternative embodiment.

FIG. 9 is a cross-sectional view illustrating a display device according to another alternative embodiment.

Referring to FIG. 9, an embodiment of a display device 3000 may include the substrate SUB, the buffer layer BFR, the active pattern ACT, the gate insulating layer GI, the gate electrode GAT, the interlayer insulating layer ILD, the source electrode SE, the drain electrode DE, the via insulating layer VIA, the first electrode ADE, the pixel defining layer PDL, the emission layer EL, the second electrode CTD, the first inorganic layer IL1, the organic layer OL, the second inorganic layer IL2, the first touch electrode 710, the third inorganic layer IL3, the second touch electrode 720, the first refraction pattern 100, a second refraction pattern 220, a first cover pattern 250, a fourth refraction pattern 420, a second cover pattern 450, a third refraction pattern 320, the polarization layer POL, the planarization layer OCA, and the window WIN.

In such an embodiment, the display device 3000 may be substantially the same as the display device 1000 described with reference to FIG. 2 except for the fourth refraction pattern 420, the second cover pattern 450, and the third refraction pattern 320.

In such an embodiment, the fourth refraction pattern 420 may be disposed on the second refraction pattern 220 and may cover the second refraction pattern 220. The fourth refraction pattern 420 may have a refractive index greater than the refractive index of the first refraction pattern 100, the refractive index of the second refraction pattern 220, and the refractive index of the third refraction pattern 320. In an embodiment, the fourth refraction pattern 420 may include or be formed of an inorganic material having the refractive index. As the fourth refraction pattern 420 has a relatively large refractive index, the light efficiency of the display device 3000 may be improved.

The second cover pattern 450 may be disposed on the first cover pattern 250 and may cover the first cover pattern 250. In an embodiment, the second cover pattern 450 may be formed together with the fourth refraction pattern 420.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display device comprising:
   a substrate;
   an emission structure disposed on the substrate;
   a first refraction pattern disposed on the emission structure, wherein the first refraction pattern has a trapezoidal cross-sectional shape;
   a second refraction pattern disposed on the first refraction pattern and covering the first refraction pattern, wherein the second refraction pattern includes an inorganic material; and
   a third refraction pattern disposed on the second refraction pattern and having a refractive index less than a refractive index of the first refraction pattern,
   wherein a thickness of the second refraction pattern is less than a thickness of the first refraction pattern.

2. The display device of claim 1, wherein the second refraction pattern is disposed between the first refraction pattern and the third refraction pattern.

3. The display device of claim 2, wherein the second refraction pattern contacts the first refraction pattern and the third refraction pattern.

4. The display device of claim 2, wherein the second refraction pattern contacts a side surface of the first refraction pattern.

5. The display device of claim 2, wherein the first refraction pattern and the third refraction pattern do not contact each other.

6. The display device of claim 1, wherein a refractive index of the second refraction pattern is greater than the refractive index of the first refraction pattern.

7. The display device of claim 6, wherein the refractive index of the first refraction pattern is in a range of about 1.6 to about 1.7.

8. The display device of claim 1, wherein a refractive index of the second refraction pattern is greater than the refractive index of the third refraction pattern.

9. The display device of claim 8, wherein the refractive index of the third refraction pattern is in a range of about 1.4 to about 1.6.

10. The display device of claim 1, wherein the emission structure includes:
    a first electrode;
    a pixel defining layer disposed on the first electrode, wherein an opening exposing the first electrode is defined in the pixel defining layer;
    an emission layer disposed in the opening; and
    a second electrode disposed on the emission layer, and
    wherein the first refraction pattern overlaps the opening.

11. The display device of claim 1, further comprising:
    a touch electrode disposed on the emission structure; and
    a cover pattern disposed in a same layer as the second refraction pattern and covering the touch electrode.

12. The display device of claim 1, further comprising:
    a touch electrode disposed on the emission structure, and
    wherein the second refraction pattern further covers the touch electrode.

13. The display device of claim 1, further comprising:
    a fourth refraction pattern disposed between the second refraction pattern and the third refraction pattern.

14. The display device of claim 13, wherein a refractive index of the fourth refraction pattern is greater than the refractive index of the first refraction pattern, a refractive index of the second refraction pattern, and the refractive index of the third refraction pattern.

15. The display device of claim 1, wherein each of the first refraction pattern and the third refraction pattern includes an organic material.

* * * * *